(12) United States Patent
Lee et al.

(10) Patent No.: US 8,053,798 B2
(45) Date of Patent: Nov. 8, 2011

(54) LIGHT EMITTING DEVICE

(75) Inventors: Sang Min Lee, Siheung-si (KR); Hyuck Jung Choi, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 342 days.

(21) Appl. No.: 12/306,664

(22) PCT Filed: Jun. 28, 2007

(86) PCT No.: PCT/KR2007/003139
§ 371 (c)(1),
(2), (4) Date: Dec. 24, 2008

(87) PCT Pub. No.: WO2008/002084
PCT Pub. Date: Jan. 3, 2008

(65) Prior Publication Data
US 2009/0230419 A1    Sep. 17, 2009

(30) Foreign Application Priority Data
Jun. 30, 2006  (KR) .......................... 10-2006-0060975

(51) Int. Cl.
*H01L 31/0203*    (2006.01)
(52) U.S. Cl. .................... 257/98; 257/100; 257/E33.061
(58) Field of Classification Search .................... 257/98, 257/100, E33.061
See application file for complete search history.

(56) References Cited

U.S. PATENT DOCUMENTS

| | | | |
|---|---|---|---|
| 6,632,379 B2 | 10/2003 | Mitomo et al. | |
| 6,809,347 B2 * | 10/2004 | Tasch et al. | 257/103 |
| 6,943,380 B2 * | 9/2005 | Ota et al. | 257/100 |
| 7,482,636 B2 * | 1/2009 | Murayama et al. | 257/98 |
| 2003/0020101 A1 * | 1/2003 | Bogner et al. | 257/233 |
| 2004/0051111 A1 * | 3/2004 | Ota et al. | 257/98 |
| 2005/0001225 A1 * | 1/2005 | Yoshimura et al. | 257/98 |
| 2006/0055309 A1 | 3/2006 | Ono et al. | |
| 2006/0081862 A1 * | 4/2006 | Chua et al. | 257/98 |
| 2007/0090381 A1 * | 4/2007 | Otsuka et al. | 257/98 |
| 2007/0221938 A1 * | 9/2007 | Radkov et al. | 257/98 |

(Continued)

FOREIGN PATENT DOCUMENTS

CN    1337989    2/2002

(Continued)

OTHER PUBLICATIONS

Extended European Search Report of Jan. 25, 2011 in corresponding European Patent Application No. 07768513.9.

(Continued)

*Primary Examiner* — Allan R Wilson
(74) *Attorney, Agent, or Firm* — H.C. Park & Associates, PLC

(57) ABSTRACT

The present invention provides a light emitting device which comprises a blue light emitting diode, and at least an ortho-silicate based phosphor for emitting light ranging from a green to yellow regions and a nitride or oxynitride based phosphor for emitting light in a red region over the light emitting diode. Accordingly, since white light with a continuous spectrum ranging from green to red can be implemented, a light emitting device with improved color rendering can be provided, and the light emitting device can be used for a general illumination or a flash. Further, since the phosphors having stable chemical characteristics against their external environment such as moisture are employed, the stability in optical characteristics of the light emitting device can also be improved.

23 Claims, 2 Drawing Sheets

U.S. PATENT DOCUMENTS

| | | | |
|---|---|---|---|
| 2007/0246732 A1* | 10/2007 | Sakuma et al. | 257/103 |
| 2007/0259206 A1* | 11/2007 | Oshio | 428/690 |
| 2008/0203901 A1* | 8/2008 | Bukesov et al. | 313/503 |
| 2009/0066230 A1* | 3/2009 | Hirosaki et al. | 313/504 |
| 2009/0218581 A1* | 9/2009 | Schmidt et al. | 257/98 |

FOREIGN PATENT DOCUMENTS

| | | |
|---|---|---|
| EP | 1 264 873 | 12/2002 |
| EP | 1 347 517 | 9/2003 |
| KR | 10-2004-0092141 | 11/2004 |
| KR | 10-2006-0025724 | 3/2006 |
| WO | 01/40403 | 6/2001 |
| WO | 2005/103199 | 11/2005 |

OTHER PUBLICATIONS

Chinese Office Action dated May 25, 2011 for CN Application No. 200780016072.3, which corresponds to U.S. Appl. No. 12/306,664.

* cited by examiner

LIGHT EMITTING DEVICE

CROSS REFERENCE TO RELATED APPLICATIONS

This application is the National Stage of International Application No. PCT/KR2007/003139, filed Jun. 28, 2007, and claims priority from and the benefit of Korean Patent Application No. 10-2006-0060975, filed on Jun. 30, 2006, which are both hereby incorporated by reference for all purposes as if fully set forth herein.

BACKGROUND OF THE INVENTION

1. Field of the Invention

The present invention relates to a light emitting device, and more specifically, to a white light emitting device which is usable for a general illumination and a flash with improved color rendering and is provided with a phosphor having stable chemical characteristics against the external environment such as moisture.

2. Discussion of the Background

A light emitting diode (LED) is a compound semiconductor having a p-n junction structure and refers to a device for emitting light through recombination of minority carriers (electrons or holes). The light emitting diodes have characteristics of low power consumption, long life span, installation in a narrow space, and a strong resistance against vibration. In recent years, white light emitting devices in addition to single color light emitting diodes, e.g. red, blue and green light emitting diodes, have been placed on the market and their demands have been rapidly increased.

A light emitting diode may implement white light by using a phosphor which serves as a wavelength conversion means. That is, the phosphor is applied on a light emitting diode, so that the color of a portion of primary light emitted from the light emitting diode and the color of secondary light whose wavelength has been converted by the phosphor are mixed to implement white color. The white light emitting diode configured as described above has been widely used since it is inexpensive and is very simple in principle and construction.

For example, onto a blue light emitting diode is applied a phosphor that emits yellowish green or yellow light using a portion of the blue light emitted from the blue light emitting diode as an excitation source, so that white light can be obtained by mixing the blue light emitted from the light emitting diode and the yellowish green or yellow light emitted from the phosphor. However, there is a problem in that since such a white light emitting diode employs a single yellow phosphor, spectrum shortage of green and red regions happens. Therefore, color rendering of the above white light emitting diode becomes low.

In order to solve the aforementioned problem, a blue light emitting diode and a phosphors excited by the blue light to emit green and red light are used to manufacture a white light emitting diode. That is, the blue light and the green and red light emitted from the excitation by the blue light may be mixed to implement white light with a high color rendering of 85 or more.

As the red light emitting phosphor, a sulfide based phosphor such as (Ca,Sr)S:Eu and (Zn,Cd)(S,Se):Ag has been typically employed. The sulfide based phosphor may control the wavelength conversion in the range of 600 nm to 660 nm depending on its composition, so that high color rendering may be obtained. However, there is a problem in that the sulfide based phosphor easily reacts with moisture and carbon dioxide in the atmosphere and is then changed into oxide or carbonate, and thus, their chemical characteristics are changed.

Further, $H_2S$ gas generated by the reaction with the phosphor and moisture changes the light emitting spectrum of the phosphor to cause a change in color coordinate and a rapid decrease in intensity and corrodes the metal such as Ag or Au formed into an electrode to lower the reliability of the light emitting diode.

A thiogallate based phosphor such as $(Ca,Sr,Ba)(Al,Ga,In)_2S_4$:Eu has been typically used as a green light emitting phosphor. The thiogallate based phosphor has excellent excitation efficiency by blue light but the thiogallate based phosphor included in a sulfide group also easily reacts with moisture, and the chemical characteristics of the phosphor are changed.

SUMMARY OF THE INVENTION

The present invention is conceived to solve the aforementioned problem in the prior art. Accordingly, an object of the present invention is to provide a light emitting device capable of implementing white light with high color rendering and usable for a general illumination or a flash by mixing and distributing at least one orthosilicate based phosphor for emitting light ranging a green to a yellow regions and a nitride or oxynitride based phosphor for emitting light in a red region over a blue light emitting diode.

Another object of the present invention is to provide a white light emitting device with improved stability in optical characteristics by employing an orthosilicate based phosphor and a nitride or oxynitride based phosphor each having stable chemical characteristics against their external environment.

According to an aspect of the present invention for achieving the objects, there is provided a light emitting device, which comprises a blue light emitting diode, and at least an orthosilicate based phosphor for emitting light ranging from a green to a yellow regions and a nitride or oxynitride based phosphor for emitting light in a red region over the light emitting diode.

The orthosilicate based phosphor may be expressed as the following Chemical Formula (1):

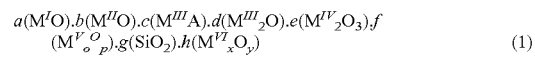

$$a(M^I O) \cdot b(M^{II} O) \cdot c(M^{III} A) \cdot d(M^{III}_2 O) \cdot e(M^{IV}_2 O_3) \cdot f(M^V_o O_p) \cdot g(SiO_2) \cdot h(M^{VI}_x O_y) \quad (1)$$

wherein $M^I$ is at least one element selected from the group consisting of Pb and Cu; $M^{II}$ is at least one element selected from the group consisting of Be, Mg, Ca, Sr, Ba, Zn, Cd and Mn; $M^{III}$ is at least one element selected from the group consisting of Li, Na, K, Rb, Cs, Au and Ag; $M^{IV}$ is at least one element selected from the group consisting of B, Al, Ga and In; $M^V$ is at least one element selected from the group consisting of Ge, V, Nd, Ta, W, Mo, Ti, Zr and Hf, $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; A is at least one element selected from the group consisting of F, Cl, Br and I; a, b, c, d, e, f, g, h, o, p, x and y are set in the ranges of $0 \leq a \leq 2$, $0 \leq b \leq 8$, $0 \leq c \leq 4$, $0 \leq d \leq 2$, $0 \leq e \leq 2$, $0 \leq f \leq 2$, $0 \leq g \leq 10$, $0 \leq h \leq 5$, $1 \leq o \leq 2$, $1 \leq p \leq 5$, $\leq x \leq 2$, and $1 \leq y \leq 5$.

Preferably, the orthosilicate based phosphor is expressed as the following Chemical Formula (2):

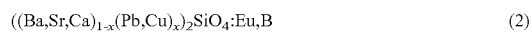

$$((Ba,Sr,Ca)_{1-x}(Pb,Cu)_x)_2 SiO_4 : Eu, B \quad (2)$$

wherein B is at least one element selected from the group consisting of Bi, Sn, Sb, Sc, Y, La, Ce, Pr, Nd, Pm, Sm, Gd, Tb, Dy, Ho, Er, Tm, Yb and Lu; x is set in the range of 0 to 1; and Eu and B are set in the ranges of 0 to 0.2.

The orthosilicate based phosphor may be expressed as the following Chemical Formula (3):

$$(2-x-y)SrO.x(Ba_u,Ca_v)O.(1-a-b-c-d)SiO_2.aP_2O_5bAl_2O_3cB_2O_3dGeO_2:yEu^{2+} \quad (3)$$

wherein x, y, a, b, c, d, u and v are set in the ranges of $0 \leq x < 1.6$, $0.005 < y < 0.5$, $x+y \leq 1.6$, $0 \leq a < 0.5$, $0 \leq b < 0.5$, $0 \leq c < 0.5$, $0 \leq d < 0.5$, and $u+v=1$; and/or the orthosilicate based phosphor may be expressed as the following Chemical Formula (4):

$$(2-x-y)BaO.x(Sr_u,Ca_v)O.(1-a-b-c-d)SiO_2.aP_2O_5bAl_2O_3cB_2O_3dGeO_2:yEu^{2+} \quad (4)$$

wherein x, y, u and v are set in the ranges of $0.01 < x < 1.6$, $0.005 < y < 0.5$, $u+v=1$, and $x \cdot u \geq 0.4$; and at least one of a, b, c and d is greater than 0.01.

The nitride based phosphor may be expressed as the following Chemical Formula (5):

$$M_xSi_yN_z:Eu \quad (5)$$

wherein M is at least one element selected from the group consisting of Ca, Sr and Ba; and $z=2/3x+4/3y$.

Preferably, $x=2$ and $y=5$, or $x=1$ and $y=7$.

The nitride based phosphor may be expressed as the following Chemical Formula (6):

$$MAlSiN_3:Eu \quad (6)$$

wherein M is at least one element selected from the group consisting of Ca, Sr, Ba and Mg.

The nitride based phosphor may be expressed as the following Chemical Formula (7):

$$MSiN_2:Eu \quad (7)$$

wherein M is at least one element selected from the group consisting of Ca, Sr, Ba and Mg.

The oxynitride based phosphor is expressed as the following Chemical Formula (8):

$$Me_xSi_{12(m+n)}Al_{(m+n)}O_nN_{16-n}:Re1_yRe2_z \quad (8)$$

wherein Me is at least one element selected from the group consisting of Ca, Mg and Y; Re1 is at least one element selected from the group consisting of Ce, Pr, Eu, Tb and Yb; and Re2 is Dy.

The light emitting device may further comprise a molding portion for encapsulating the light emitting diode, wherein the light emitting diode is mounted on a body, the molding portion is formed on the body, and the orthosilicate based phosphor and the nitride or oxynitride based phosphor are mixed and distributed in the molding portion. The body may be one of a substrate, a heat sink and a lead terminal.

According to the present invention, a light emitting device contains an orthosilicate based phosphor and an nitride or oxynitride based phosphor for emitting very excellent green, yellow and red light from the excitation of blue light to implement white light with a continuous spectrum ranging from green to red, so that the light emitting device can have more excellent color rendering. The light emitting device of the present invention can implement white light with high color rendering of at least 85, and thus, the light emitting device can be employed as a flash light source as well as a general illumination.

Further, since a phosphor having stable chemical characteristics against an external environment such as moisture is employed in a light emitting device of the present invention, stability in optical characteristics of the light emitting device can be improved.

DETAILED DESCRIPTION OF THE ILLUSTRATED EMBODIMENTS

Figure 1:
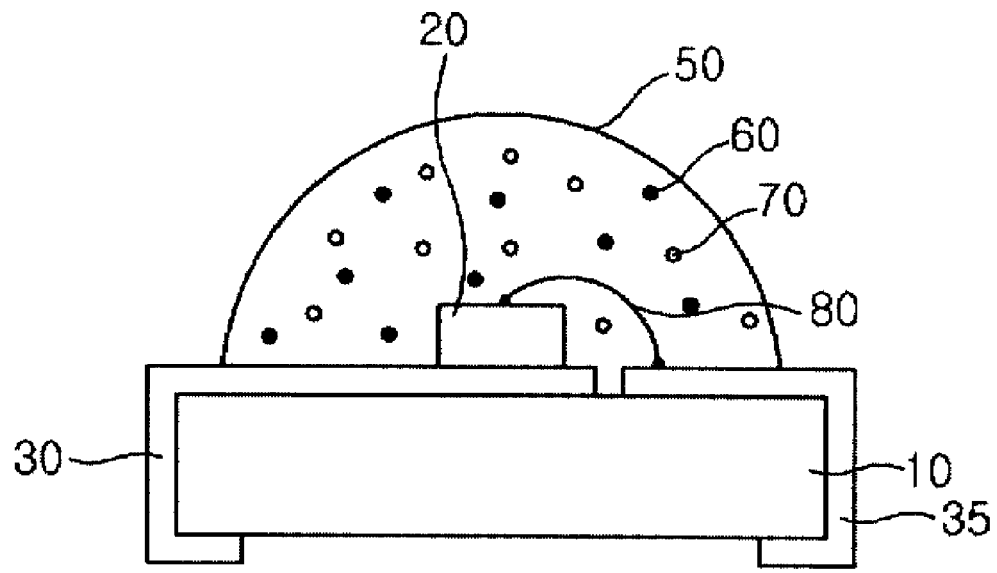
FIG. 1 is a sectional view showing a chip-type light emitting device according to the present invention.

Hereinafter, a light emitting device according to the present invention will be described in detail with reference to the accompanying drawings. However, the present invention is not limited to a preferred embodiment set forth herein but can be implemented in various different forms. Rather, the preferred embodiment is merely provided to allow the present invention to be completely described herein and to fully convey the scope of the invention to those skilled in the art. In the drawings, like elements are designated by like reference numerals.

The light emitting device of the present invention comprises at least one orthosilicate based phosphor having a wavelength band ranging from a green to a yellow regions and a nitride or oxynitride based phosphor having a wavelength band of a red region such that green, yellow and red light can be emitted in a very excellent way by the excitation of light in a blue region.

The orthosilicate based phosphor has a structure expressed by the following Chemical Formula (1):

$$a(M^IO).b(M^{II}O).c(M^{III}A).d(M^{III}_2O).e(M^{IV}_2O_3).f(M^V_2O_p).g(SiO_2).h(M^{VI}_xO_y) \quad (1)$$

In Chemical Formula (1), $M^I$ is at least one element selected from the group consisting of Pb and Cu; $M^{II}$ is at least one element selected from the group consisting of Be, Mg, Ca, Sr, Ba, Zn, Cd and Mn; $M^{III}$ is at least one element selected from the group consisting of Li, Na, K, Rb, Cs, Au and Ag; $M^{IV}$ is at least one element selected from the group consisting of B, Al, Ga and In; $M_V$ is at least one element selected from the group consisting of Ge, V, Nd, Ta, W, Mo, Ti, Zr and Hf, $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb and Lu; and A is at least one element selected from the group consisting of F, Cl, Br and I.

Further, in Chemical Formula (1), a, b, c, d, e, f, g, h, o, p, x and y are set in the ranges of $0 \leq a \leq 2$, $0 \leq b \leq 8$, $0 \leq c \leq 4$, $0 \leq d \leq 2$, $0 \leq e \leq 2$, $0 \leq f \leq 2$, $0 \leq g \leq 10$, $0 \leq h \leq 5$, $1 \leq o \leq 2$, $1 \leq p \leq 5$, $1 \leq x \leq 2$, and $1 \leq y \leq 5$.

Preferably, the orthosilicate based phosphor is expressed as the following Chemical formula (2):

$$((Ba,Sr,Ca)_{1-x}(Pb,Cu)_x)_2SiO_4:Eu,B \quad (2)$$

In Chemical Formula (2), B is at least one element selected from the group consisting of Bi, Sn, Sb, Sc, Y, La, Ce, Pr, Nd, Pm, Sm, Gd, Tb, Dy, Ho, Er, Tm, Yb and Lu. Further, x is set in the range of 0 to 1, and Eu and B are set in the ranges of 0 to 0.2.

The orthosilicate based phosphor is expressed as the following Chemical Formula (3):

$$(2-x-y)SrO.x(Ba_u,Ca_v)O.(1-a-b-c-d)SiO_2.aP_2O_5bAl_2O_3cB_2O_3dGeO_2:yEu^{2+} \quad (3)$$

wherein x, y, a, b, c, d, u, and v are set in the ranges of $0 \leq x<1.6$, $0.005<y<0.5$, $x+y \leq 1.6$, $0 \leq a<0.5$, $0 \leq b<0.5$, $0 \leq c<0.5$, $0 \leq d<0.5$ and $u+v=1$; and/or the orthosilicate based phosphor is expressed as the following Chemical Formula (4):

$$(2-x-y)BaO.x(Sr_u,Ca_v)O.(1-a-b-c-d)SiO_2.aP_2O_5bAl_2O_3cB_2O_3dGeO_2:yEu^{2+} \quad (4)$$

wherein x, y, u and v are set in the ranges of $0.01<x<1.6$, $0.005<y<0.5$, $u+v=1$, and $x \cdot u \geq 0.4$; and at least one of a, b, c and d is greater than 0.01.

The nitride based phosphor is expressed as the following Chemical Formula (5):

$$M_xSi_yN_z:Eu \quad (5)$$

In Chemical Formula (5), M is at least one element selected from the group consisting of Ca, Sr and Ba; and $z=2/3x+4/3y$. Preferably, $x=2$ and $y=5$, or $x=1$ and $y=7$.

The nitride based phosphor is expressed as the following Chemical Formula (6):

$$MAlSiN_3:Eu \quad (6)$$

In Chemical Formula (6), M is at least one element selected from the group consisting of Ca, Sr, Ba and Mg.

The nitride based phosphor is expressed as the following Chemical Formula (7):

$$MSiN_2:Eu \quad (7)$$

In Chemical Formula (7), M is at least one element selected from the group consisting of Ca, Sr, Ba and Mg.

The oxynitride based phosphor is expressed as the following Chemical Formula (8):

$$Me_xSi_{12-(m+n)}Al_{(m+n)}O_nNi_{16-n}:Re1_y,Re2_z \quad (8)$$

In Chemical Formula (8), Me is at least one element selected from the group consisting of Ca, Mg and Y; Re1 is at least one element selected from the group consisting of Ce, Pr, Eu, Tb and Yb; and Re2 is Dy.

Green, yellow and red lights may be implemented in a very excellent way under the excitation of light in the blue region by using the aforementioned phosphors according to the present invention. Specifically, the orthosilicate based phosphor and the nitride or oxynitride based phosphor according to the present invention have a strong resistance against moisture, so that a light emitting device with high reliability against the external environment such as moisture may be implemented.

Hereinafter, the light emitting device in which the aforementioned phosphors are employed according to the present invention will be described with reference to the accompanying drawings.

FIG. 1 is a sectional view showing a chip-type light emitting device according to the present invention.

Referring to this figure, the light emitting device comprises a substrate 10, first and second electrodes 30 and 35 formed on the substrate 10, a light emitting diode 20 mounted on the first electrode 30, and a molding portion 50 for encapsulating the light emitting diode 20. At least an orthosilicate based phosphor 60 and a nitride or oxynitride based phosphor 70 are uniformly mixed and distributed in the molding portion 50.

The substrate 10 may be formed with a predetermined groove at a central region where the light emitting diode 20 is mounted, and the groove may be formed in such a manner that its sidewall surface can be inclined at a predetermined slope. At this time, the light emitting diode 20 is mounted on a bottom surface of the groove, and the sidewall surface with a predetermined slope allows light emitted from the light emitting diode 20 to be reflected to the utmost and thus light emitting efficiency to be increased.

The electrodes 30 and 35 are configured of first and second electrodes 30, 35, which are connected to anode and cathode terminals of the light emitting diode 20 on the substrate 10, respectively. The first and second electrodes 30 and 35 may be formed through a printing technique. The first and second electrodes 30 and 35 are made of a metallic material such as copper or aluminum with excellent conductivity and are configured to be electrically insulated from each other.

The light emitting diode 20 is a GaN, InGaN, AlGaN or AlGaInN based blue light emitting diode. In this embodiment, a light emitting diode for emitting blue light in the range of 420 to 480 nm is employed. However, the present invention is not limited thereto but may further include a light emitting diode for emitting ultraviolet rays in the range of 250 to 410 nm in addition to the blue light. Only one light emitting diode may be employed, or a plurality of light emitting diodes may be employed, if desired.

The light emitting diode 20 is mounted on the first electrode 30 and is electrically connected to the second electrode 35 through a wire 80. Alternatively, in a case where the light emitting diode 20 is mounted not on the first or second electrode 30 or 35 but on the substrate 10, the light emitting diode 20 can be connected to the first and second electrodes 30 and 35 through two wires 80, respectively.

Further, the molding portion 50 for encapsulating the light emitting diode 20 is formed on the substrate 10. As described above, at least an orthosilicate based phosphor 60 and a nitride or oxynitride based phosphor 70 are uniformly mixed and distributed in the molding portion 50. The molding portion 50 may be formed through an injection process by using a mixture of a predetermined transparent epoxy resin and the phosphors 60 and 70. Alternatively, the molding portion 50 may be formed in such a manner that it is manufactured in a separate mold and is then pressed or heat treated. The molding portion 50 may be formed into various shapes such as an optical lens type, a flat plate type, and a type in which unevenness is formed on its surface.

In such a light emitting device according to the present invention, primary light is emitted from the light emitting diode 20 and the phosphors 60 and 70 excited by the primary light emit wavelength-converted secondary light, so that a color in a desired spectrum region can be implemented by mixing the primary and secondary light. That is, blue light is emitted from the blue light emitting diode, the orthosilicate based phosphor excited by the blue light emits green to yellow light, and the nitride or oxynitride based phosphor excited by the blue light emits red light. Thus, a portion of the blue light (the primary light) may be mixed with the green, yellow and red light (the secondary light) to implement white light. Accordingly, the light emitting device of the present invention can implement white light with a continuous spectrum ranging from green to red such that its color rendering can be improved.

Figure 2:
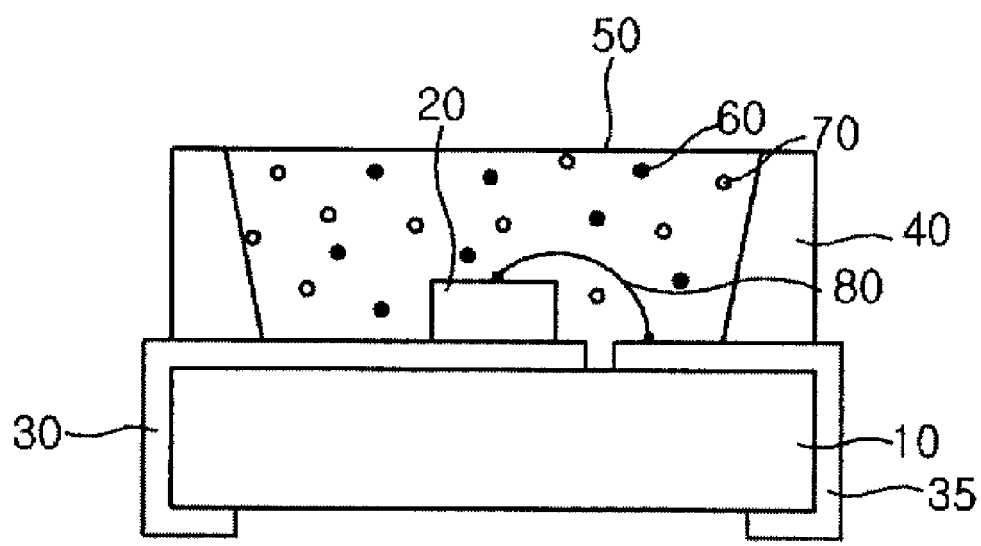
FIG. 2 is a sectional view showing a top-view light emitting device according to the present invention.

FIG. 2 is a sectional view showing a top-view light emitting device according to the present invention.

Referring to this figure, the light emitting device comprises a substrate 10, first and second electrodes 30 and 35 formed on the substrate 10, and a light emitting diode 20 mounted on the first electrode 30. The top-view light emitting device is almost identical with the chip-type light emitting device in view of their configurations, and thus, detailed descriptions thereof will be replaced with those described with reference to FIG. 1. However, the top-view light emitting device comprises a reflector 40 formed on the substrate 10 to encompass the light emitting diode 20, and a molding portion 50 filled into a central hole of the reflector 40 to protect the light emitting diode 20.

In order to improve light brightness and light collecting capability, an inner sidewall of the reflector 40 encompassing the light emitting diode can be formed to have a predetermined slope. Preferably, such a configuration allows the reflection of light emitted from the light emitting diode 20 to be maximized and the light emitting efficiency to be increased.

At least an orthosilicate based phosphor 60 and a nitride or oxynitride based phosphor 70 are uniformly mixed and distributed in the molding portion 50. Accordingly, primary light emitted from the light emitting diode 20 is mixed with wavelength-converted secondary light from the respective phosphors 60 and 70 to implement a color in a desired spectrum range.

Figure 3:
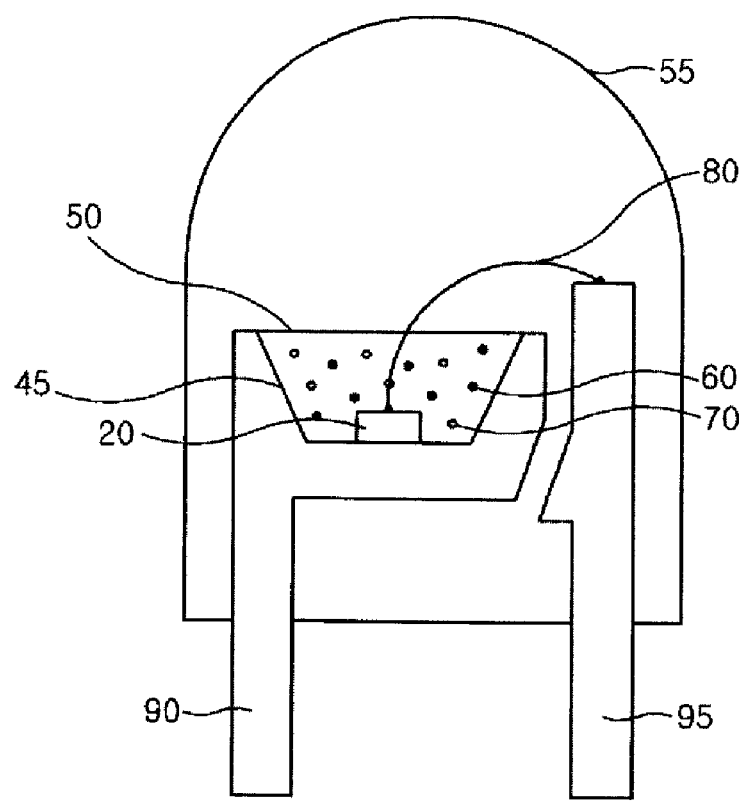
FIG. 3 is a sectional view showing a lamp-type light emitting device according to the present invention.

FIG. 3 is a sectional view showing a lamp-type light emitting device according to the present invention.

Referring to this figure, the light emitting device comprises a first lead terminal 90 formed with a reflecting portion 45, and a second lead terminal 95 spaced apart from the first lead terminal 90 by a predetermined interval. A light emitting diode 20 is mounted on the reflecting portion 45 of the first lead terminal 90 and is electrically connected to the second lead terminal 95 through a wire 80. A molding portion 50 containing phosphors 60 and 70 is formed on the light emitting diode 20 and an outer peripheral molding portion 55 is formed on front ends of the lead terminals 90 and 95. At least one orthosilicate based phosphor 60 and a nitride or oxynitride based phosphor 70 are uniformly mixed and distributed in the molding portion 50, the orthosilicate based phosphors 60 and the nitride or oxynitride based phosphors 70 absorbing light emitted from the light emitting diode 20 to convert the absorbed light into light with respective specific wavelengths. The outer peripheral molding portion 55 is made of a transparent epoxy resin to improve the transmittance of light emitted from the light emitting diode 20.

Figure 4:
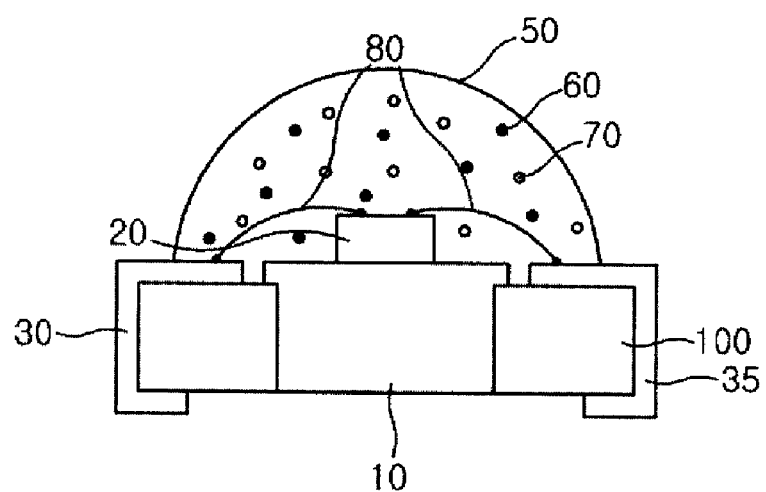
FIG. 4 is a sectional view showing a light emitting device including a housing according to the present invention.

FIG. 4 is a sectional view showing a light emitting device including a housing according to the present invention.

Referring to this figure, the light emitting device comprises a housing 100 formed with electrodes 30 and 35 at both sides thereof and with a through hole, a substrate 10 mounted in the through hole of the housing 100, and a light emitting diode 20 mounted on the substrate 10. At this time, the substrate 10 may be formed of a certain material with excellent thermal conductivity to serve as a heat sink such that heat emitted from the light emitting diode 20 can be more effectively released. The light emitting device further comprises a molding portion 50 for encapsulating the light emitting diode 20. Further, in the molding portion 50 are uniformly mixed and distributed at least an orthosilicate based phosphor 60 and a nitride or oxynitride based phosphor 70.

The electrodes 30 and 35 are configured of first and second electrodes 30 and 35 which are connected to anode and cathode terminals of the light emitting diode 20 on the substrate 10, respectively. The light emitting diode 20 is mounted on the substrate 10 and is electrically connected to the first or second electrode 30 or 35 through a wire 80.

As described above, the present invention may be applied to articles with various structures, and the technical spirit of the present invention is not limited to the aforementioned embodiments but may be modified or changed in various ways.

The invention claimed is:

1. A light emitting device, comprising:
a blue light emitting diode;
an orthosilicate based phosphor to emit light ranging from a green region to a yellow region and
a nitride and an oxynitride based phosphor to emit light in a red region over the light emitting diode,
wherein the oxynitride based phosphor is expressed as the following Chemical Formula (8):

$$Me_xSi_{12-(m+n)}Al_{(m+n)}O_nN_{16-n}:Re1_y,Re2_z \qquad (8)$$

wherein Me is at least one element selected from the group consisting of Ca, Mg, and Y; Re1 is at least one element selected from the group consisting of Ce, Pr, Eu, Tb, and Yb; and Re2 is Dy.

2. The light emitting device as claimed in claim 1, wherein the orthosilicate based phosphor is expressed as the following Chemical Formula (3):

$$(2-x'-y')SrO.x'(Ba_u,Ca_v)O.(1-a-b-c-d)\\SiO_2.aP_2O_5bAl_2O_3cB_2O_3dGeO_2:y'Eu^{2+} \qquad (3)$$

wherein x', y', a, b, c, d, u, and v are set in the ranges of $0 \leq x' < 1.6$, $0.005 < y' < 0.5$, $x'+y \leq 1.6$, $0 \leq a < 0.5$, $0 \leq b << 0.5$, $0 \leq c < 0.5$, $0 \leq d < 0.5$, and $u+v=1$.

3. The light emitting device as claimed in claim 1, wherein the nitride based phosphor is expressed as the following Chemical Formula (5):

$$M_{x'}Si_{y'}N_{z'}:Eu \qquad (5)$$

wherein M is at least one element selected from the group consisting of Ca, Sr, and Ba; and $z'=2/3x'+4/3y'$.

4. The light emitting device as claimed in claim 3, wherein $x'=2$ and $y'=5$, or $x'=1$ and $y'=7$.

5. The light emitting device as claimed in claim 1, wherein the nitride based phosphor is expressed as the following Chemical Formula (6):

$$MAlSiN_3:Eu \qquad (6)$$

wherein M is at least one element selected from the group consisting of Ca, Sr, Ba, and Mg.

6. The light emitting device as claimed in claim 1, wherein the nitride based phosphor is expressed as the following Chemical Formula (7):

$$MSiN_2:Eu \qquad (7)$$

wherein M is at least one element selected from the group consisting of Ca, Sr, Ba, and Mg.

7. The light emitting device as claimed in claim 1, further comprising a molding portion encapsulating the light emitting diode, wherein the light emitting diode is mounted on a body, the molding portion is arranged on the body, and the orthosilicate based phosphor and the nitride based phosphor or oxynitride based phosphor are mixed and distributed in the molding portion.

8. The light emitting device as claimed in claim 7, wherein the body is one of a substrate, a heat sink, and a lead terminal.

9. The light emitting device as claimed in claim 1, wherein the orthosilicate based phosphor is expressed as the following Chemical Formula (4):

$$(2-x'-y')BaO.x'(Sr_u,Ca_v)O.(1-a-b-c-d)\\SiO_2.aP_2O_5bAl_2O_3cB_2O_3dGeO_2:y'Eu^{2+} \qquad (4)$$

wherein x', y', u, and v are set in the ranges of $0.01 < x' < 1.6$, $0.005 < y' < 0.5$, $u+v=1$, and $x'.u \geq 0.4$; and at least one of a, b, c, and d is greater than 0.01.

10. A light emitting device, comprising:
a blue light emitting diode; and
an orthosilicate based phosphor to emit light ranging from a green region to a yellow region, and a nitride or oxynitride based phosphor to emit light in a red region over the light emitting diode,
wherein the orthosilicate based phosphor is expressed as the following Chemical Formula (1):

$$a(M^I O).b(M^{II}O).c(M^{III}A).d(M^{III}_2O).e(M^{IV}_2O_3).f(M^V_oO_p).g(SiO_2).h(M^{VI}_xO_y) \quad (1)$$

wherein $M^I$ is at least one element selected from the group consisting of Pb and Cu; $M^{II}$ is at least one element selected from the group consisting of Be, Mg, Ca, Sr, Ba, Zn, Cd, and Mn; $M^{III}$ is at least one element selected from the group consisting of Li, Na, K, Rb, Cs, Au, and Ag; $M^{IV}$ is at least one element selected from the group consisting of B, Al, Ga, and In; $M^V$ is at least one element selected from the group consisting of Ge, V, Nd, Ta, W, Mo, Ti, Zr, and Hf; $M^{VI}$ is at least one element selected from the group consisting of Bi, Sn, Sb, Sc, Y, La, Ce, Pr, Nd, Pm, Sm, Eu, Gd, Tb, Dy, Ho, Er, Tm, Yb, and Lu; A is at least one element selected from the group consisting of F, Cl, Br, and I; a, b, c, d, e, f, g, h, o, p, x, and y are set in the ranges of $0 \leq a \leq 2$, $0 \leq b \leq 8$, $0 \leq c \leq 4$, $0 \leq d \leq 2$, $0 \leq e \leq 2$, $0 \leq f \leq 2$, $0 \leq g \leq 10$, $0 \leq h \leq 5$, $1 \leq o \leq 2$, $1 \leq p \leq 5$, $1 \leq x \leq 2$, and $1 \leq y \leq 5$.

11. The light emitting device as claimed in claim 10, wherein the nitride based phosphor is expressed as the following Chemical Formula (5):

$$M_{x'}Si_{y'}N_z:Eu \quad (5)$$

wherein M is at least one element selected from the group consisting of Ca, Sr, and Ba; and $z=2/3x'+4/3y'$.

12. The light emitting device as claimed in claim 11, wherein $x'=2$ and $y'=5$, or $x'=1$ and $y'=7$.

13. The light emitting device as claimed in claim 10, wherein the nitride based phosphor is expressed as the following Chemical Formula (6):

$$MAlSiN_3:Eu \quad (6)$$

wherein M is at least one element selected from the group consisting of Ca, Sr, Ba, and Mg.

14. The light emitting device as claimed in claim 10, wherein the nitride based phosphor is expressed as the following Chemical Formula (7):

$$MSiN_2:Eu \quad (7)$$

wherein M is at least one element selected from the group consisting of Ca, Sr, Ba, and Mg.

15. The light emitting device as claimed in claim 10, further comprising a molding portion encapsulating the light emitting diode, wherein the light emitting diode is mounted on a body, the molding portion is arranged on the body, and the orthosilicate based phosphor and the nitride based phosphor or oxynitride based phosphor are mixed and distributed in the molding portion.

16. The light emitting device as claimed in claim 15, wherein the body is one of a substrate, a heat sink, and a lead terminal.

17. A light emitting device, comprising:
a blue light emitting diode; and
an orthosilicate based phosphor to emit light ranging from a green region to a yellow region, and a nitride or oxynitride based phosphor to emit light in a red region over the light emitting diode,
wherein the orthosilicate based phosphor is expressed as the following Chemical Formula (2):

$$((Ba,Sr,Ca)_{1-x}(Pb,Cu)_x)_2SiO_4:Eu,B \quad (2)$$

wherein B is at least one element selected from the group consisting of Bi, Sn, Sb, Sc, Y, La, Ce, Pr, Nd, Pm, Sm, Gd, Tb, Dy, Ho, Er, Tm, Yb, and Lu; x is set in the range of 0 to 1; and Eu and B are set in the ranges of 0 to 0.2.

18. The light emitting device as claimed in claim 17, wherein the nitride based phosphor is expressed as the following Chemical Formula (5):

$$M_{x'}Si_{y'}N_z:Eu \quad (5)$$

wherein M is at least one element selected from the group consisting of Ca, Sr, and Ba; and $z=2/3x'+4/3y$.

19. The light emitting device as claimed in claim 18, wherein $x'=2$ and $y=5$, or $x'=1$ and $y=7$.

20. The light emitting device as claimed in claim 17, wherein the nitride based phosphor is expressed as the following Chemical Formula (6):

$$MAlSiN_3:Eu \quad (6)$$

wherein M is at least one element selected from the group consisting of Ca, Sr, Ba, and Mg.

21. The light emitting device as claimed in claim 17, wherein the nitride based phosphor is expressed as the following Chemical Formula (7):

$$MSiN_2:Eu \quad (7)$$

wherein M is at least one element selected from the group consisting of Ca, Sr, Ba, and Mg.

22. The light emitting device as claimed in claim 17, further comprising a molding portion encapsulating the light emitting diode, wherein the light emitting diode is mounted on a body, the molding portion is arranged on the body, and the orthosilicate based phosphor and the nitride based phosphor or oxynitride based phosphor are mixed and distributed in the molding portion.

23. The light emitting device as claimed in claim 22, wherein the body is one of a substrate, a heat sink, and a lead terminal.

* * * * *